United States Patent
Zad Issa et al.

(10) Patent No.: US 9,837,102 B2
(45) Date of Patent: Dec. 5, 2017

(54) USER ENVIRONMENT AWARE ACOUSTIC NOISE REDUCTION

(71) Applicants: Syavosh Zad Issa, Kirkland, WA (US); Youhong Lu, Redmond, WA (US); Rod G. Fleck, Bellevue, WA (US); Hundraj S. Gopal, Bellevue, WA (US)

(72) Inventors: Syavosh Zad Issa, Kirkland, WA (US); Youhong Lu, Redmond, WA (US); Rod G. Fleck, Bellevue, WA (US); Hundraj S. Gopal, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 119 days.

(21) Appl. No.: 14/321,813

(22) Filed: Jul. 2, 2014

(65) Prior Publication Data

US 2016/0005422 A1     Jan. 7, 2016

(51) Int. Cl.

| | |
|---|---|
| *G06F 17/20* | (2006.01) |
| *G06F 17/28* | (2006.01) |
| *G10L 21/00* | (2013.01) |
| *G10L 15/26* | (2006.01) |
| *G10L 25/84* | (2013.01) |
| *H03G 3/32* | (2006.01) |
| *G10L 21/02* | (2013.01) |

(Continued)

(52) U.S. Cl.
CPC .............. *G10L 25/84* (2013.01); *G10L 21/02* (2013.01); *G10L 21/0216* (2013.01); *H03G 3/32* (2013.01); *G10L 25/51* (2013.01)

(58) Field of Classification Search
CPC ... G06F 9/30072; H03G 3/32; G10L 21/0208; G10L 15/20; G10L 21/02

USPC ......................... 704/226, 233, 236
See application file for complete search history.

(56) References Cited

U.S. PATENT DOCUMENTS

| 5,727,072 A | 3/1998 | Raman |
|---|---|---|
| 5,857,088 A * | 1/1999 | Keith .................. G06F 9/30072 |
| | | 341/65 |

(Continued)

FOREIGN PATENT DOCUMENTS

EP     1760696 A2    3/2007

OTHER PUBLICATIONS

Ma, et al., "Acoustic Environment Classification", In Proceedings of ACM Transactions on Speech and Language Processing, vol. 3, No. 2, Jul. 2006, pp. 1-22.

(Continued)

*Primary Examiner* — Akwasi M. Sarpong

(57) ABSTRACT

Examples of the disclosure describe user environment aware single channel acoustic noise reduction. A noisy signal received by a computing device is transformed and feature vectors of the received noisy signal are determined. The computing device accesses classification data corresponding to a plurality of user environments. The classification data for each user environment has associated therewith a noise model. A comparison is performed between the determined feature vectors and the accessed classification data to identify a current user environment. A noise level, a speech level, and a speech presence probability from the transformed noisy signal are estimated and the noise signal is reduced based on the estimates. The resulting signal is outputted as an enhanced signal with a reduced or eliminated noise signal.

20 Claims, 5 Drawing Sheets

(51) Int. Cl.
*G10L 21/0216* (2013.01)
*G10L 25/51* (2013.01)

(56) References Cited

U.S. PATENT DOCUMENTS

| | | | | |
|---|---|---|---|---|
| 6,098,038 | A * | 8/2000 | Hermansky | G10L 21/0208 704/226 |
| 7,107,210 | B2 * | 9/2006 | Deng | G10L 21/0208 704/226 |
| 8,285,344 | B2 * | 10/2012 | Kahn | H03G 3/32 361/56 |
| 8,639,502 | B1 * | 1/2014 | Boucheron | G10L 21/02 381/94.1 |
| 2007/0177180 | A1 * | 8/2007 | Yamada | H04N 1/00931 358/1.13 |
| 2009/0290718 | A1 * | 11/2009 | Kahn | H03G 3/32 381/57 |
| 2010/0153104 | A1 * | 6/2010 | Yu | G10L 21/0208 704/233 |
| 2011/0261983 | A1 * | 10/2011 | Claussen | H04R 25/505 381/317 |
| 2012/0158404 | A1 * | 6/2012 | Shin | G10L 21/0216 704/233 |
| 2013/0262101 | A1 * | 10/2013 | Srinivasan | G10L 21/0208 704/226 |

OTHER PUBLICATIONS

Chang, Joon-Hyuk, "Noisy Speech Enhancement Based on Improved Minimum Statistics Incorporating Acoustic Environment-Awareness", In Journal of Digital Signal Processing, vol. 23, Issue 4, Jul. 2013, pp. 1233-1238.
Nsabimana, et al., "A Single Channel Speech Enhancement Technique using Psychoacoustic Principles", In Proceedings of 17th European Signal Processing Conference, Aug. 24, 2009, pp. 170-174.
Borgstrom, et al., "Improved Speech Presence Probabilities Using HMM-Based Inference, with Applications to Speech Enhancement and ASR", In IEEE Journal of Selected Topics in Signal Processing, vol. 4, Issue 5, Oct. 2010, pp. 1-9.
"Noise Reduction Software", Published on: Jul. 12, 2012 Available at: http://www.vocal.com/noise-reduction/, 4 pages.
Ma, et al., "Context Awareness using Environmental Noise Classification", In Proceedings of 8th European Conference on Speech Communication and Technology, Sep. 1, 2003, 4 pages.
Eronen, et al., "Audio-Based Context Awareness—Acoustic Modeling and Perceptual Evaluation", In Proceedings of IEEE International Conference on Acoustics, Speech, and Signal Processing, vol. 5, Apr. 6, 2003, pp. 529-532.
Mohammadiha, et al., "Simultaneous Noise Classification and Reduction Using a Priori Learned Models", In IEEE International Workshop on Machine Learning for Signal Processing, Sep. 22, 2013, 6 pages.
Lun, et al., "Improved Speech Presence Probability Estimation Based on Wavelet Denoising", In Proceedings of IEEE International Symposium on Circuits and Systems, May 20, 2012, pp. 1018-1021.
Krishnamurthy, et al., "Environment Dependent Noise Tracking for Speech Enhancement", In International Journal of Speech Technology, vol. 16, Issue 3, Dec. 13, 2012, 10 pages.
Chung, King, "Reducing Noise Interference", Published on: Apr. 6, 2010 Available at: http://www.asha.org/Publications/leader/2010/100406/Reducing-Noise-Interference.htm, 8 pages.
Aboulnasr, et al., "A Robust Variable Step-Size LMS-Type Algorithm: Analysis and Simulations", In IEEE Transactions on Signal Processing, vol. 45, Issue 3, Mar. 1997, pp. 631-639.
El-Maleh, et al., "Frame-Level Noise Classification in Mobile Environments", In IEEE International Conference on Acoustics, Speech, and Signal Processing, vol. 1, Mar. 1999, pp. 237-240.
Cohen, et al., "Speech Enhancement for Non-Stationary Noise Environments", Signal Processing, vol. 81, Issue 11, Nov. 2001, pp. 2403-2418.
Jae-Hun, et al., "A Statistical Model-Based Speech Enhancement Using Acoustic Noise Classification for Robust Speech Communication", IEICE Transactions on Communications, Communications Society, No. 7, Jul. 2012, pp. 2513-2516.
"International Search Report & Written Opinion Issued in PCT Application No. PCT/US2015/038716", dated Sep. 15, 2015, 13 pages.

* cited by examiner

USER ENVIRONMENT AWARE ACOUSTIC NOISE REDUCTION

BACKGROUND

Some consumer and commercial electronic devices implement single channel acoustic noise reduction (SCANR) to reduce noise (e.g., environmental noise) from a single stream of audio signal. These devices use various types of spectral subtraction techniques to reduce the noise in the audio signal. The spectral subtraction techniques are somewhat suitable for only stationary noise or very slow varying noise. However, in real time user environments, the noise is not stationary and may vary significantly over a period of time.

SUMMARY

Examples of the disclosure describe a user environment-aware acoustic noise reduction technique. A noisy signal received by a computing device is transformed, and feature vectors of the received noisy signal are determined. Classification data corresponding to a plurality of user environments is accessed. The classification data for each user environment has an associated noise model and speech presence probability. A comparison is performed between the determined feature vectors and the accessed classification data to identify a current user environment. A noise level from the transformed noisy signal is estimated based on the noise model and the speech presence probability associated with the identified user environment. Based on the estimated noise level, the noise model, and the speech presence probability associated with the identified current user environment, the noise level from the transformed noisy signal is reduced to output an enhanced signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Corresponding reference characters indicate corresponding parts throughout the drawings.

DETAILED DESCRIPTION

Referring to the figures, examples of the disclosure enable user environment-aware acoustic noise reduction for a computing device 302. In some examples, a current user environment of the computing device 302 is identified by comparing feature vectors of a received noisy signal (e.g., including a speech signal and a noise signal) with classification data 310 for a plurality of user environments. Each user environment has associated therewith at least a noise model. The noise model associated with the identified current user environment is applied to estimate a noise level, a speech level, and a speech presence probability (SPP) in the transformed noisy signal. This estimation is an accurate estimation of the noise level, the speech level, and the SPP that the computing device 302 is likely to encounter in the current user environment at least because the noise model for the identified current user environment enables the system to select the right thresholds and parameters corresponding to the current user environment. These thresholds and parameters are a function of the environment type and are pre-stored in the memory area 308 for each of the plurality of user environments, in some examples. Based on the estimated noise level, the speech level, and the SPP and the noise model associated with the current user environment, the noise signal is reduced from the transformed noisy signal. The noise model associated with the identified current user environment may describe any environment. For example, the noise model may describe a car, pub, café, pink noise, clean speech, etc. as the current user environment.

Examples of the system described herein consider knowledge about the user environment to estimate and reduce noise in the audio signal. Aspects of the disclosure further enable improvement in the signal to noise ratio, improvement in the subjective quality of processed speech (e.g., by ensuring through the noise model for the current user environment that the speech is not distorted or made unnatural in the process of reducing noise), and/or improvement in the subjective quality of residual noise. Improvement in the subjective quality of residual noise occurs by ensuring through the noise model for the current user environment that noise is optimally reduced. The noise may not be reduced if the noise reduction may result in speech distortion or the speech may appear unnatural by such noise reduction. By identifying the current user environment and using the thresholds and parameters associated with the identified current user environment, the system is robust to variations in signal to noise ratio (SNR) for that identified user environment. For example, the system performs real-time adaptation of detection and tracking thresholds based on the determined noise type in the environment.

Figure 3:
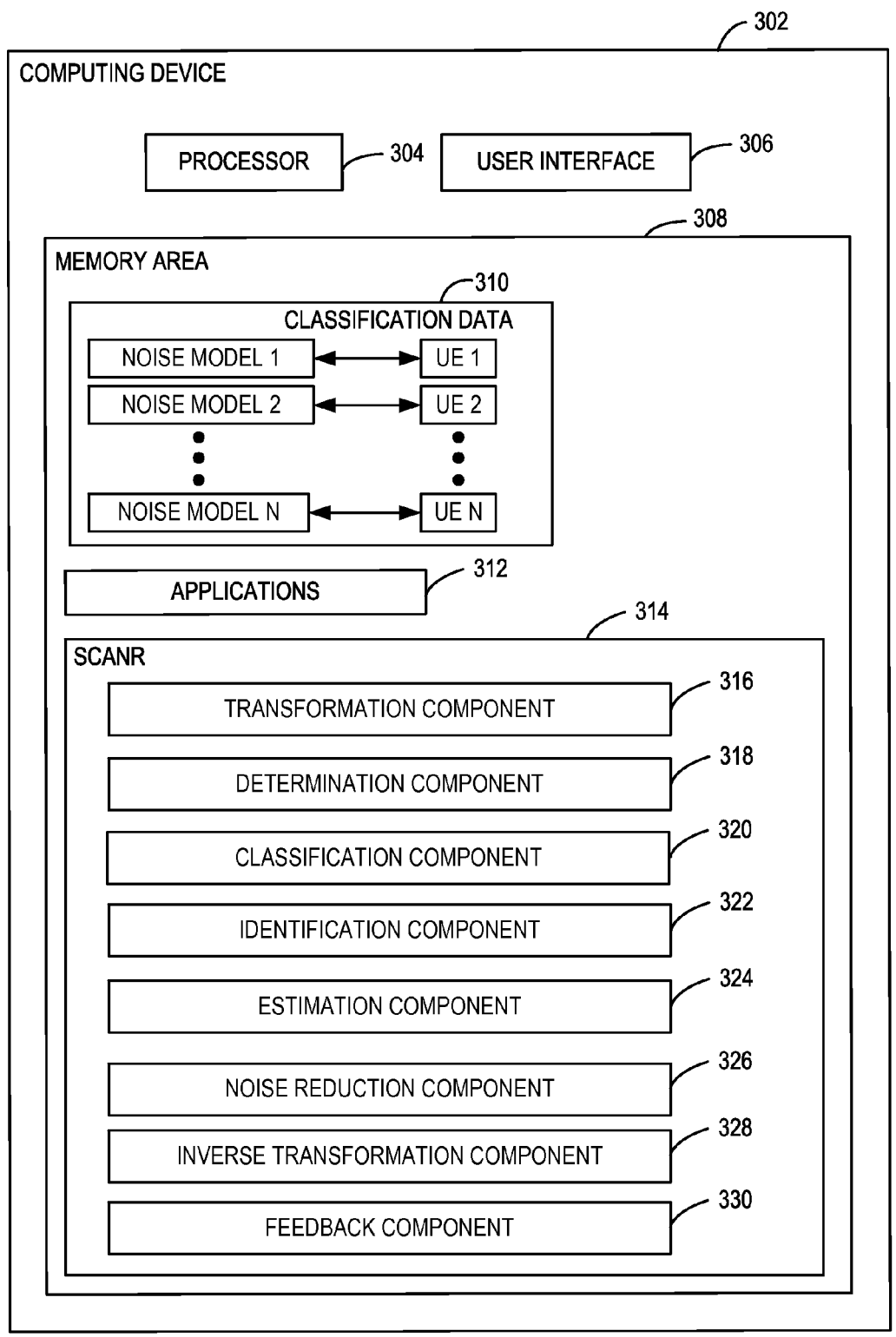
FIG. 3 is an exemplary block diagram illustrating components of a computing device for outputting a noise reduced enhanced signal from a noisy signal.

Aspects of the disclosure provide a user environment-aware system for acoustic noise reduction. A processor 304 associated with the system receives a noisy signal and creates a transform of the received noisy signal. The noisy signal includes a speech signal (e.g., a desired portion in the noisy signal representing user's voice) and a noise signal (e.g., an undesired portion in the noisy signal representing residual noise present in the user environment). Feature vectors of the received noisy signal are determined and compared with classification data 310 (as shown in FIG. 3) to identify the current user environment. A noise level, a speech level, and the SPP for the transformed noisy signal are estimated based on the noise model associated with the identified user environment. The estimation may include estimating, based on the noise model, the noise level and the speech level for the transformed noisy signal and further calculating the SPP (e.g., at runtime) using the estimated noise level and the speech level. In this way, the SPP is calculated as a more accurate SPP because the system is aware of the noise model for the current user environment.

Accurate calculation of the SPP provides a more robust and accurate noise reduction. At least because the system knows about the various parameters likely to be associated with the received noisy signal, sudden spurts in noise level (e.g., most likely a false alarm) in the noisy signal are eliminated or reduced.

Further, the noise signal from the transformed noisy signal is reduced based on the noise model associated with the identified current user environment and the estimated noise level, the speech level, and the SPP. Upon reduction of the noise signal, an enhanced speech signal based on the speech signal from the noisy signal is output. That is, not only does the system reduce the noise, it also enhances the signal quality. In some examples, the system confirms the identification of the current user environment. Confirming the identified current user environment occurs by selecting the most frequently identified current user environment over a predefined time period (e.g., smoothing over 500 milliseconds, or over some predefined quantity of frames). Alternatively or in addition, confirming the identified current user environment occurs when the identified current user environment is the same for at least a predefined number of frames (e.g., 3 frames out of the last 5 frames) of the noisy signal.

Figure 1:
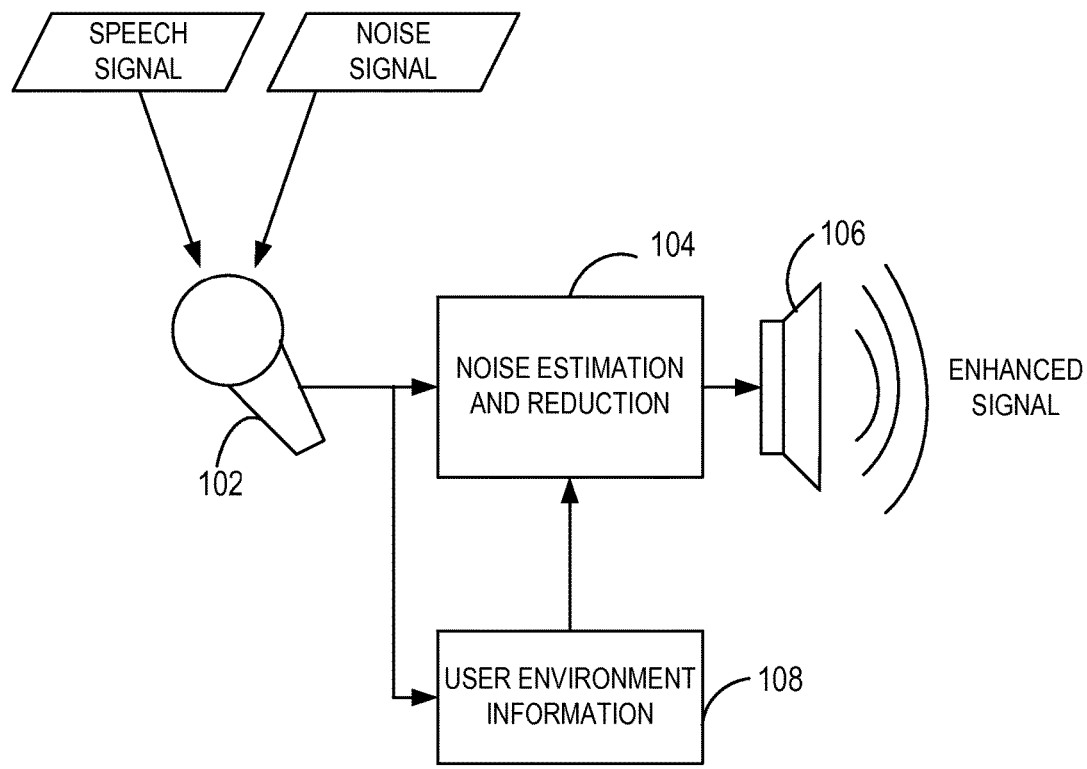
FIG. 1 is an exemplary block diagram illustrating noise estimation and reduction by considering user environment information.

Referring again to FIG. 1, an exemplary block diagram illustrates noise estimation and reduction by considering user environment information. In the example of FIG. 1, a microphone 102, or other input device, receives a noisy signal, which includes a speech signal and a noise signal. Other input devices include analog-to-digital converters, and/or the output from a spatial processing front-end in a multi-microphone device. Noise estimation and reduction in block 104 is performed by considering user environment information 108 associated with the received noisy signal. The noise reduced speech signal (e.g., the enhanced signal) is outputted through a speaker 106. Examples of the disclosure are operable with one microphone or with multiple microphones.

Figure 2:
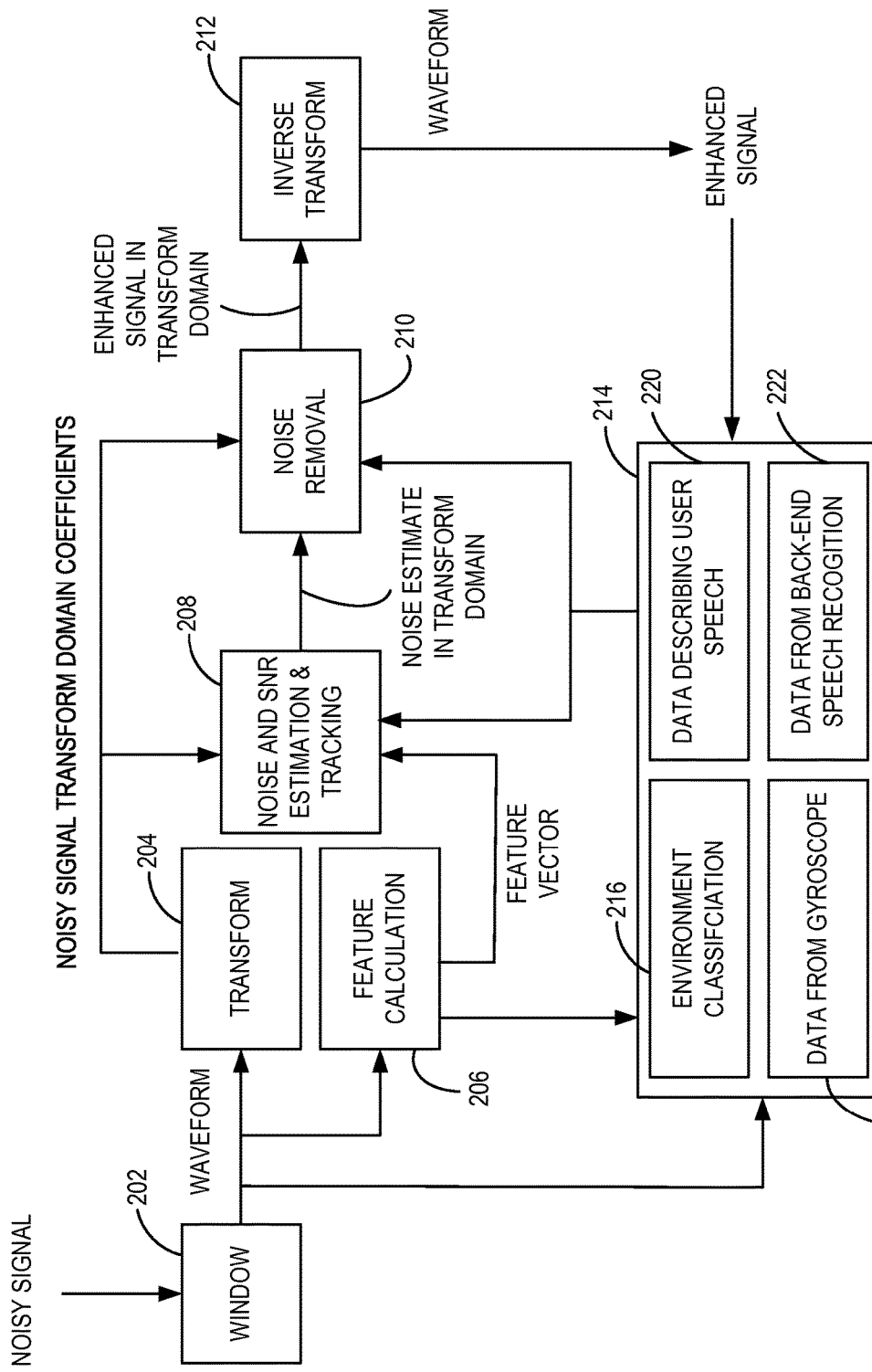
FIG. 2 is an exemplary block diagram illustrating an architecture for producing a noise-reduced enhanced signal.

Referring next to FIG. 2, an exemplary block diagram illustrates an architecture for outputting a noise reduced enhanced signal from a noisy signal. A waveform is generated from a noisy signal by a window 202. The window 202 generates a time segmented waveform (e.g., a sample of the noisy signal) representing speech as well as non-speech segments (e.g., segments representing silence or no speech signal). The waveform generated by the window 202 is transformed at transform 204 into noisy signal transform domain coefficients. In some examples, the transformation is into a frequency domain, although other domains are contemplated. Feature vectors, from the waveform generated by the window 202, are calculated by feature calculation 206. The feature vectors are a compact representation of the incoming signal over the time window analyzed. Feature vectors include, for example, MFCC, frequency domain representation, DCT, or any other transform or representation. From the waveform generated by the window 202 and the features vectors calculated by feature calculation 206, a current user environment is identified from an environment classifier 214. The environment classifier 214 includes environment classification 216, data from a gyroscope 218, data describing user speech 220, and data from back-end speech recognition 222. The environment classifier 214 may include other components and/or modules that help in identifying the current user environment.

The classification data 310 for each user environment is associated with a noise model (e.g., a noise type in that user environment). By identifying the current user environment and thus the noise model associated with the current user environment, SPP is calculated more accurately. The SPP defines a probability for the presence of the speech signal in the noisy signal. The SPP may be defined as identifying presence of silence, presence of speech, presence of noise only, or presence of both speech and noise in the received noisy signal.

Data from the gyroscope 218 is leveraged to improve noise detection and estimation. The data from the gyroscope 218 provides a state of the computing device 302 (e.g., stationary or moving). This information may be used as part of the classification data 310 to estimate and reduce noise in the noisy signal. Data from the gyroscope may be used in both single microphone devices and multiple microphone devices. In some examples, the gyroscope reports the three coordinates of the device (e.g., x, y, and z). Variations in this data are indicative of whether the device is held in a stationary position or moving/rotating.

If the device is moving/rotating, this knowledge may be leveraged. Noise reduction operates in a transformed domain (e.g., frequency, sub-bands, etc.). If there is a diffuse noise source (e.g., non-directional or isotropic noise source such that there is the same level of noise almost anywhere in the space), then the signal level estimate for the transformed domain coefficients does not change significantly as the device is moving/rotating (unlike when there is point source noise and/or desired speech of the device user). For example, the delta in consecutive data from sensors may indicate that the device is moving or rotating, yet operations of the disclosure (when performed) indicate that the signal level estimate in the transform domain is not changing much. Aspects of the disclosure conclude that, for those transform domain coefficients that are stationary, there is primarily diffuse noise and hence the noise level estimator may be updated more confidently (e.g., increase the adaptation rate, reduce the SPP for those transform domain coefficients, etc.). This in turn improves the robustness and responsiveness of the SCANR to diffuse noises that may be rapidly time varying.

If the device is stationary in space (e.g., not moving/rotating per the gyroscope) and the transform domain coefficients are also stationary in time, the operations of the disclosure (when performed) conclude that it is most likely noise in the signal. Aspects of the disclosure then update the noise level estimate more confidently (e.g., increase the update rate).

If the device is stationary in space (e.g., the difference between consecutive data from gyroscope is zero or very small) and the transform domain coefficients are changing rapidly with time, operations of the disclosure (when performed) conclude that there is likely not diffuse noise. Hence, there is either speech or a rapidly changing noise. Aspects of the disclosure may then decide to slow/tame the noise update rate.

If the device is not stationary in space (e.g., the difference between consecutive data from the gyroscope is greater than a threshold) and the transform domain coefficients are changing rapidly with time, no conclusion is drawn with regard to whether there is diffuse noise. In such an example, the SCANR is more conservative (e.g., slow) in updating the noise level estimate.

Learning derived from the user speech characteristics (e.g., the speaker's speech characteristics like gender, age, language etc.) and the data from the back-end speech recognition 222 (e.g., whether voice recognition fails) also help to improve noise detection and estimation. A speaker's speech characteristics and/or speaker identification may also be used as part of the classification data 310 to estimate and reduce noise in the noisy signal. Data from the back-end speech recognition 222 may be used for improving the classification data 310, such as by learning from the back-end speech recognition the most likely user environment for the received noisy signal. In some examples, each recognition engine has a front end noise reduction requirement which may differ from one engine to other. Noise reductions from these engines may adversely impact speech recognition engines due to not enough or too much noise suppression, spectrally distorting the speech, removing too much of the desired speech, and/or introducing level variation in speech. These distortions happen when the noise reduction engine does not have an accurate estimation of the actual noise. Aspects of the disclosure provide a robust, reliable, and/or accurate noise estimate thereby improving backend speech recognition.

In this manner, using information from the gyroscope, and/or any other sensor, provides the components described herein more confidence to properly update the noise level estimates in the transformed domain thereby benefitting the back end speech recognition engine.

In block 208, the noise and SNR is estimated and tracked from the transformed noisy signal produced by transform 204 and associated with the current user environment identified by the environment classifier 214. Block 208 provides a noise estimate in the transform domain that, along with the current user environment identified by the environment classifier 214, is used by block 210 for noise elimination, reduction, removal, or other adjustment. Noise reduction may be defined as, in some examples, producing an output SNR that is greater than the input SNR while introducing the least amount of perceptible distortion in the speech signal. The output of block 210 is an enhanced signal in the transform domain that is then inversely transformed in block 212 to generate a waveform representing the enhanced signal. In some examples, the resulting enhanced signal from block 212 is looped back to the environment classifier 214 as feedback to further improve noise estimation and reduction for the current user environment (e.g., which may not have been reflective of the actual current environment). For example, a deviation in the identification of the current user environment is corrected in one or more subsequent iterations of the operations for improved noise estimation and reduction.

Referring next to FIG. 3, an exemplary block diagram illustrates the computing device 302 outputting a noise reduced enhanced signal from a noisy signal. In the example of FIG. 3, the computing device 302 associated with a user represents a system for providing user environment aware acoustic noise reduction. The computing device 302 represents any device executing instructions (e.g., as application programs, operating system functionality, or both) to implement the operations and functionality described herein. The computing device 302 may include a mobile computing device or any other portable device. In some examples, the mobile computing device includes a mobile telephone, laptop, tablet, computing pad, netbook, gaming device, wearable device, headset (e.g., BLUETOOTH brand headset), and/or portable media player. The computing device 302 may also include less portable devices such as a smart TV, desktop personal computers, kiosks, and tabletop devices. Additionally, the computing device 302 may represent a group of processing units or other computing devices. The computing device 302 operates to perform noise reduction in various scenarios including, for example, telephony (e.g., cellular, voice over Internet Protocol, BLUETOOTH brand communications, and Wi-Fi communications), voice recognition (e.g., as performed by the computing device 302 or by a cloud service), home sensor data processing (e.g., any device with a microphone in a home setting to capture voice commands), and/or medical applications (e.g., removing noise from a biological signal).

In some examples, the computing device 302 has at least one processor 304, a memory area 308, and at least one user interface 306. The processor 304 includes any quantity of processing units, and is programmed to execute computer-executable instructions for implementing aspects of the disclosure. The instructions may be performed by the processor 304 or by multiple processors executing within the computing device 302, or performed by a processor external to the computing device 302. In some examples, the processor 304 is programmed to execute instructions such as those illustrated in the figures (e.g., FIG. 4 and FIG. 5). Alternatively or in addition, the processor 304 may receive the results of at least a portion of the instructions illustrated in the figures (e.g., FIG. 4 and FIG. 5) being executed by an entity (e.g., a cloud service) other than the computing device 302.

In some examples, the processor 304 represents an implementation of analog techniques to perform the operations described herein. For example, the operations may be performed by an analog computing device and/or a digital computing device.

The computing device 302 further has one or more computer readable media such as the memory area 308. The memory area 308 includes any quantity of media associated with or accessible by the computing device 302. The memory area 308 may be internal to the computing device 302 (as shown in FIG. 3), external to the computing device 302, or both. In some examples, the memory area 308 includes read-only memory and/or memory wired into an analog computing device.

The memory area 308 stores, among other data, one or more applications 312. The applications 312, when executed by the processor 304, operate to perform functionality on the computing device 302. Exemplary applications 312 include mail application programs, web browsers, calendar application programs, address book application programs, messaging programs, media applications, location-based services, search programs, speech recognition applications, voice communication applications, and the like. The applications 312 may communicate with counterpart applications or services such as web services accessible via a network. For example, the applications 312 may represent downloaded client-side applications that correspond to server-side services executing in a cloud.

The memory area 308 further stores the classification data 310 corresponding to a plurality of user environments. The classification data 310 for each user environment (e.g., UE 1, UE 2, . . . UE N) includes a noise model associated therewith. As shown in FIG. 3, exemplary classification data 310 shows Noise Model 1 associated with UE 1, Noise Model 2 associated with UE 2, and Noise Model associated with UE N. In some examples, the memory area 308 also stores SNR histograms (e.g., calculated at runtime and referred to as running histograms) for each of the user environments and thresholds and parameters associated with each of the user environments. The current user environment identified by the environment classifier 214 helps in choosing the nearest possible matching values of the threshold and the parameters associated with the current user environment. This further helps in accurately calculating the SPP that is used, in some examples, for reducing and/or eliminating the noise signal from the noisy signal.

The memory area 308 further stores a single channel acoustic noise reduction (SCANR) module 314 that comprises one or more computer-executable components. Exemplary components in the SCANR module 314 include a transformation component 316, a determination component 318, a classification component 320, an identification component 322, an estimation component 324, a noise reduction component 326, an inverse transformation component 328, and a feedback component 330. The transformation component 316, when executed by the processor 304 associated with the computing device 302, causes the processor 304 to transform the noisy signal received by the computing device 302. The transformation component 316 may use any technique (e.g., Fast Fourier Transform, etc.) known in the art to transform the noisy signal. For example, the received noisy signal is transformed into a frequency domain, although other domains are contemplated. The transformation of the signal from time domain to another domain makes it easier to classify the noise. The environment classifier 214 is trained over the same set of feature vectors so that the identification of the current user environment is an accurate determination. The determination component 318, when executed by the processor 304 associated with the computing device 302 causes the processor 304 to determine feature vectors of the received noisy signal. The determination component 318 determines the feature vectors of the received noisy signal by computing Mel-Scale frequency cepstral coefficients (MFCC), or MFCC's first or second derivatives. Other ways of representing the feature vectors are also contemplated and within the scope of the disclosure.

The classification component 320, when executed by the processor 304 associated with the computing device 302, causes the processor 304 to access the classification data 310 corresponding to a plurality of user environments. The classification data 310 for each user environment includes a noise model associated therewith. The identification component 322, when executed by the processor 304 associated with the computing device 302, causes the processor 304 to identify a current user environment of the computing device 302 based on a comparison of the feature vectors determined by the determination component 318 with the classification data 310 accessed by the classification component 320. In some examples, the identification component 322 identifies that user environment as the current user environment that consistently provides the most closely matched result in the classification data 310 (e.g., over a predefined period of time). The estimation component 324, when executed by the processor 304 associated with the computing device 302, causes the processor 304 to estimate, based on the noise model associated with the current user environment identified by the identification component 322, a noise level, a speech level, and SPP for the transformed noisy signal. The estimated noise level represents an accurate estimation of the noise level and the speech level at that time because this estimation also uses the thresholds and parameters for the identified current user environment. The estimated noise level and the speech level are used for estimating and/or calculating the SPP. In this manner, the estimated noise level and the speech level represent a better or exact estimation of the noise level and the speech level than the previous rough estimation provided by the environment classifier 214.

The noise reduction component 326, when executed by the processor 304 associated with the computing device 302, causes the processor 304 to reduce, based on the noise level, the speech level and the SPP estimated by the estimation component 324 and the noise model associated with the current user environment identified by the identification component 322, a noise signal from the transformed noisy signal to output an enhanced signal. Because the noise reduction component 326, like the estimation component 324, considers the identified current user environment parameters (e.g., the noise model), the noise is removed or at least reduced from the noisy signal without affecting the subjective quality of the enhanced signal.

The inverse transformation component 328, when executed by the processor 304 associated with the computing device 302, causes the processor 304 to inversely transform (e.g., using inverse Fast Fourier Transform) the enhanced signal outputted by the noise reduction component 326 to output the enhanced signal in a waveform instead of in the transform domain. In some examples, the inversely transformed enhanced signal is consumed by the user of the computing device 302. Additionally or alternatively, the feedback component 330, when executed by the processor 304 associated with the computing device 302, causes the processor 304 to feed back the inversely transformed enhanced signal by the inverse transformation component 328, to adjust, update, revise, or otherwise change the classification data 310 for the identified current user environment. Adjustment of the classification data 310 results in improving the classification data 310 so that subsequent identification of the user environment (e.g., the current user environment at a subsequent time) is improved. In some examples, the thresholds and parameters for the identified current user environment are updated (or stored in the memory area 308) by feeding back the inversely transformed enhanced signal. The system thus implements a learning environment that learns about the exact parameters for each user environment.

In some examples, the system uses machine learning algorithms to characterize the user environments. A known good speech signal (e.g., a signal known to contain speech with minimal noise) across a predefined large range of samples is applied to one or more user environments (e.g., noisy environments). Upon the application of the known good speech signal, aspects of the disclosure apply machine learning algorithms to improve the quality of the classification data 310 as the user environments are characterized. By better classifying the user environments, the comparison of the feature vectors (e.g., determined from the transformed noisy signal) with the accurately classified classification data 310 identify the current user environment more accurately. Thereby, the estimation of the noise level, speech level, and the speech presence probability are also more accurate resulting in better noise reduction. Aspects of the disclosure are operable with any form of machine learning algorithm, such as generative models (e.g., Hidden Markov model, Naïve Bayes, and the like), discriminative models (e.g., linear discriminant analysis, boosting, support vector machines, and the like), and/or any other type of machine learning algorithms.

In some examples, the identification of the current user environment by the identification component 322 further considers data from a gyroscope, data from back-end speech recognition, and/or speaker-speech characteristics. For example, speaker identification or speaker dependent identification of the current user environment from the received noisy signal improves the quality of the enhanced signal.

In some examples, the memory area 308 further includes a communications interface component. The communications interface component includes a network interface card and/or computer-executable instructions (e.g., a driver) for operating the network interface card. Communication between the computing device 302 and other devices may occur using any protocol or mechanism over any wired or wireless connection. In some examples, the communications interface is operable with near-field communication (NFC) tags.

In some examples, the memory area 308 further includes the user interface 306 or other user interface component. The user interface component further includes a graphics card for displaying data to the user and receiving data from the user. The user interface component may also include computer-executable instructions (e.g., a driver) for operating the graphics card. Further, the user interface component may include a display (e.g., a touch screen display or natural user interface) and/or computer-executable instructions (e.g., a driver) for operating the display. The user interface component may also include one or more of the following to provide data to the user or receive data from the user: speakers, a sound card, a camera, a microphone, a vibration motor, one or more accelerometers, a BLUETOOTH brand communication module, global positioning system (GPS) hardware, and/or a photoreceptive light sensor. For example, the user may input commands or manipulate data by moving the computing device 302 in a particular way.

Figure 4A:
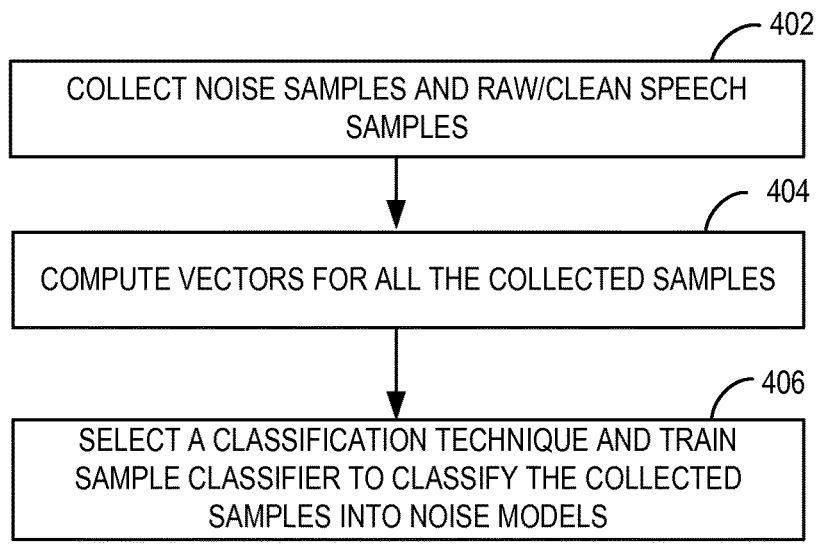
FIG. 4A is an exemplary flow chart illustrating operations of the computing device for training a sample classifier to classify collected noise samples into noise models.

Referring next to FIG. 4A, the exemplary flow chart illustrates operations of the computing device 302 for training a sample classifier to classify collected noise samples into noise models. At 402, noise samples and raw and/or clean speech samples are collected. The collected noise samples represent at least a predefined number of user environments. These predefined number of user environments is updated, for example, when a new user environment is differentiated from already-known user environments. At 404, feature vectors for all the collected samples are computed. At 406, a classification technique (e.g., MFCC and its first and second derivatives) is selected and a sample classifier is trained to classify the collected noise samples into noise models. Each noise model represents a noise type most likely to be present in a particular user environment. The noise models are classified by training the sample classifier with training data to identify a current user environment for a real-time noisy signal.

Figure 4B:
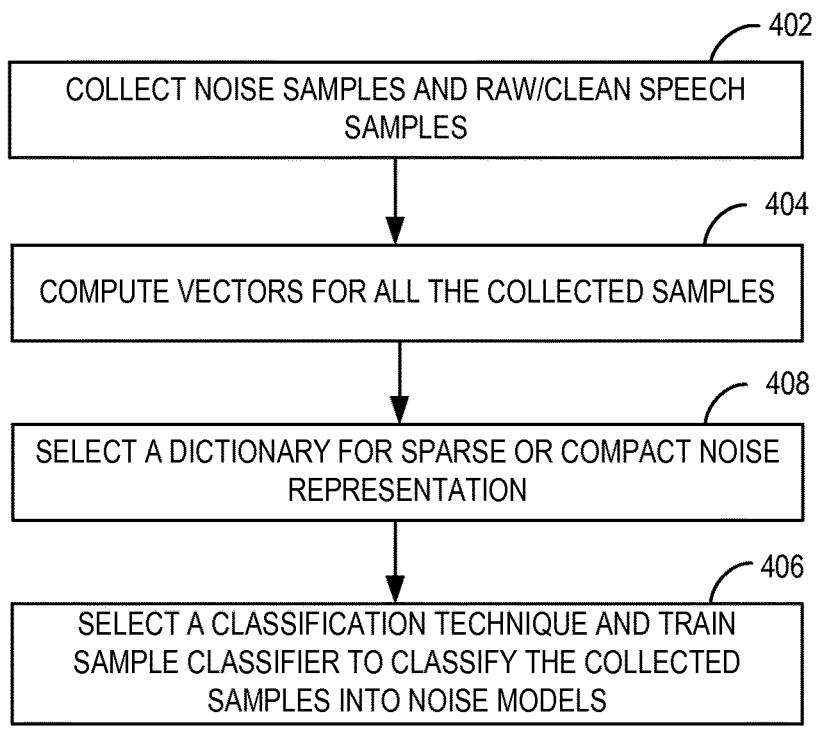
FIG. 4B is an exemplary flow chart illustrating operations of the computing device for training a sample classifier to classify collected noise samples into noise models.

Referring next to FIG. 4B, the exemplary flow chart illustrates operations of the computing device 302 for training a sample classifier to classify collected noise samples into noise models. At 402, noise samples and raw and/or clean speech samples are collected. The collected noise samples represent at least a predefined number of user environments. These predefined number of user environments is updated, for example, when a new user environment is differentiated from already-known user environments. At 404, feature vectors for all the collected samples are computed. At 408, a dictionary for sparse or compact noise representation is selected (e.g., from dictionaries for transforms like Fourier, wavelet, Gabor transforms, and the like). At 406, a classification technique (e.g., MFCC and its first and second derivatives) is selected and a sample classifier is trained to classify the collected noise samples into noise models. Each noise model represents a noise type most likely to be present in a particular user environment. The noise models are classified by training the sample classifier with training data to identify a current user environment for a real-time noisy signal.

Figure 5:
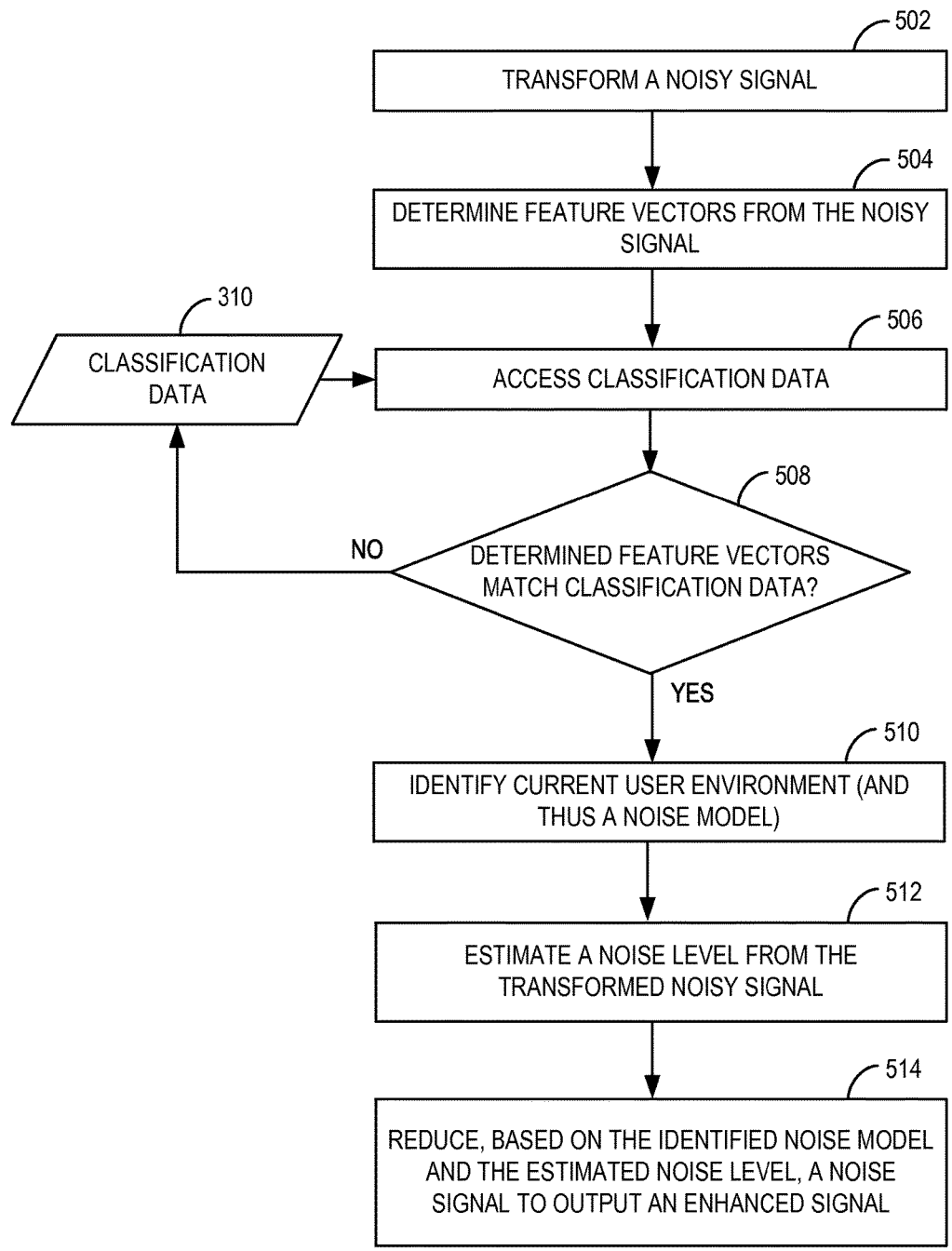
FIG. 5 is an exemplary flow chart illustrating operations of the computing device to reduce noise signal from a noisy signal by considering the current user environment.

Referring next to FIG. 5, the exemplary flow chart illustrates operations of the computing device 302 to reduce the noise component of a noisy signal by considering the current user environment. At 502, a noisy signal received by the computing device 302 is transformed (e.g., into a frequency domain using Fast Fourier Transform or other known techniques). At 504, feature vectors of the received noisy signal are determined (e.g., by computing the MFCC). Classification data 310 corresponding to a plurality of user environments is accessed at 506. The classification data 310 for each of the user environments includes a noise model associated therewith. At 508, the feature vectors determined at 504 are compared with the classification data 310 accessed at 506. If at 508 it is determined that the feature vectors do not match the classification data 310 by at least a predefined threshold level (e.g., more than 80 percent, or other threshold or confidence value), the noisy signal is associated with a new user environment associated with a new noise model (e.g., not already included in the classification data 310). In such a scenario, the classification data 310 is updated to help in correctly identifying the current user environment for future samples of a similar noisy signal.

However, if at 508, the computing device 302 determines that the feature vectors match a portion of the classification data 310 by at least a predefined threshold level, the current user environment is identified, for the noisy signal, from the classification data 310. The comparison is performed in a probabilistic sense in that the environment whose features more closely match the incoming data (e.g., consistently over some period of time) is declared as the best candidate or best match representing the user environment.

At 512, a noise level, a speech level, and the SPP for the transformed noisy signal is estimated based on the noise model associated with the current user environment identified at 510. At 514, a noise signal, from the noisy signal is reduced, based on the estimated noise level, speech level, and the SPP and the noise model associated with the identified current user environment, to output the enhanced signal. The enhanced signal may include a lesser amount of the noise signal after the reduction at 514. The outputted enhanced signal may be inversely transformed into a waveform and looped back to adjust the classification data 310 for the identified current user environment.

In some examples, identification of the current user environment is confirmed when the identified current user environment is determined to be the most frequently identified current user environment over a predefined time period and/or the identified current user environment is the same for at least a predefined number of frames of the noisy signal. This eliminates an occasional false positive of a current user environment resulting from a rapid change in noise and/or speech activity. In some examples, the process of identifying the current user environment is repeated after a predefined time period (e.g., 40 milliseconds) using an updated noisy signal (e.g., additionally received frames of data from the noisy signal).

In some examples, the memory area 308 also stores an SNR histogram for each user environment. In such examples, an SNR histogram for the received noisy signal is calculated. The SNR histogram reflects the probability (e.g., from 0 to 1) that the signal corresponds to the noise types (e.g., pub, café, etc.). The calculated SNR histogram is compared with the SNR histograms (e.g., stored in the memory area 308) for the plurality of user environments. Based on the comparison, the current user environment is identified. In some examples, the SNR histograms are calculated for all frequency bands. In some other examples, the SNR histograms are calculated only for a maximum SNR and/or an average SNR. The information from the calculated SNR histogram may be used to revise/update the SPP for the identified user environment. The revised SPP enables a more accurate estimate of the noise level. In some examples, a second voice activity detection value is derived for the identified user environment. For example, the likely presence of another speaker (e.g., colleague's voice) may be identified in a conversation in an office environment. The second voice activity detection value may additionally be used for estimating the noise level (e.g., at operation 512 in FIG. 5).

In some examples, a psychoacoustic weighting is applied to the estimated noise level to determine a level of suppression per frequency band. The psychoacoustic weighting reduces any adverse effect of noise reduction on signal naturalness and clarity. The determined level of suppression (e.g., using known noise suppression techniques) is applied to the enhanced signal. The enhanced signal is converted to the time domain for consumption by devices such as the speaker 106.

Additional Examples

In some examples, at the beginning of a conversation, the noisy signal is assumed to include only the noise signal for at least a predefined time period since the processor begins identification of the current user environment. For example, in the case of a mobile device conversation, the microphone 102 of the mobile device may start receiving the noise signal at the beginning of the conversation (e.g., before the call recipient says "hello"). For this initial time period, the noisy signal is assumed to comprise only the noise signal without any of the speech signal (e.g., without the desired audio signal).

In some examples, aspects of the disclosure initially calculate a rough estimate of the noise level and the speech level. Given the awareness of the user environment (e.g., identified current user environment and its associated noise model as an output of the environment classifier 214), a set of thresholds and parameters are chosen corresponding to the background noise for the user environment that the environment classifier 214 has identified or detected. Using these thresholds and parameters, the SPP is computed in a more reliable way. Subsequently, aspects of the disclosure re-estimate the noise level, the speech level, and the SPP (this time reliably and robustly).

Aspects of the disclosure are operable with any form of noise model. Some exemplary noise models are described below:

1) Based on MFCC:
    a) Data structure
        i. Mean of MFCC
        ii. Speed of change of MFCC (e.g., delta between two sets of MFCC from consecutive windows)
        iii. Acceleration: Delta between speed (ii) of two sets of MFCC from consecutive frames
2) Based on energy in critical bands:
    a) Data structure
        i. Mean of critical band energy
        ii. Speed of change of critical band energy (e.g., delta between two sets of critical band energy from consecutive windows)
        iii. Acceleration: Delta between speed (ii) of two sets of critical band energy from consecutive frames
3) Based on discrete cosine transform (DCT) coefficients:
    a) After windowing the noise, calculate the correlation matrix
    b) Apply DCT transform and keep all or a subset of coefficients
    c) Compute the above for all windows of noise, for all noises
    d) For each noise type:
        i. Measure mean
        ii. Measure variance
        iii. Measure rate or speed of change (speech)
        iv. Measure acceleration (rate of speed)
    e) Noise model (for each noise type):
        i. Mean of DCT coefficients and their variance
        ii. Speed of change in mean and in variance
        iii. Acceleration in mean and variance
4) Based on Gamma tone filters:
    a) After windowing the noise, calculate the correlation matrix
    b) Decompose the signal according to gamma tone filters (gamma tone filters are a close approximation of inner ear sound decomposition)
    c) Keep the statistics of most prominent gamma tone filters and their contributions to the noise in hand across all windows corresponding to the noise/environment in hand.
    d) Noise model (for each noise type):
        i. Mean of DCT coefficients and their variance
        ii. Speed of change in mean and in variance
        iii. Acceleration in mean and variance Particular examples of noise models are included in Appendix A. For example, an MFCC noise model based on a second order Gaussian Mixture Model is described. However, aspects of the disclosure are operable with any form of noise model.

In an example scenario, a mean and a variance of the determined feature vectors are calculated and the calculated mean and variance are compared with the classification data 310 to identify the noise model for the current user environment. In such scenarios, there may be multiple noise models associated with one user environment.

Alternatively or in addition to the other examples described herein, examples include any combination of the following:

confirming the identified current user environment upon determining that the identified current user environment is the same for at least a predefined number of frames of the noisy signal and/or by identifying a most frequently identified current user environment over a predefined time period wherein the noisy signal includes only the noise signal for at least a predefined time period upon beginning the identification of the current user environment wherein the memory area 308 further stores an SNR histogram for each of the plurality of user environments and the processor 304 is programmed to identify the current user environment by:
    calculating an SNR histogram for the received noisy signal;
    comparing the calculated SNR histogram with the SNR histograms for the plurality of user environments; and
    identifying the current user environment based on the comparison wherein the processor 304 is further programmed to repeat, after a predefined time period, identification of the current user environment based on an updated noisy signal wherein the noise model associated with the identified current user environment is selected from a group consisting of a car, a pub, a café, pink noise, or clean speech wherein the processor 304 is further programmed to:
    calculate a mean and a variance of the determined feature vectors; and compare the calculated mean and the variance with the classification data 310 to identify the noise model for the current user environment.

wherein the processor is further programmed to:
inversely transform the outputted enhanced speech signal; and
revise the classification data 310 for the identified current user environment based on the inversely transformed enhanced speech signal.

wherein the processor 304 is further programmed to identify the current user environment by considering data selected from a group consisting of data from a gyroscope, data from back end speech recognition, or speaker-speech characteristics.

wherein the processor 304 is programmed to create the transform of the received noisy signal in a frequency domain, and wherein the processor is programmed to determine the feature vectors of the received noisy signal by computing MFCC.

At least a portion of the functionality of the various elements shown in the figures may be performed by other elements in the figures, or an entity (e.g., processor, web service, server, application program, computing device, etc.) not shown in the figures.

In some examples, the operations illustrated in FIGS. 4A, 4B, and 5 may be implemented as software instructions encoded on a computer readable medium, in hardware programmed or designed to perform the operations, or both. For example, aspects of the disclosure may be implemented as a system on a chip or other circuitry including a plurality of interconnected, electrically conductive elements.

Examples have been described with reference to data monitored and/or collected from the users. In some examples, notice may be provided to the users of the collection of the data (e.g., via a dialog box or preference setting) and users are given the opportunity to give or deny consent for the monitoring and/or collection. The consent may take the form of opt-in consent or opt-out consent.

While the aspects of the disclosure have been described in terms of various examples with their associated operations, a person skilled in the art would appreciate that a combination of operations from any number of different examples is also within the aspects of the disclosure.

Exemplary Operating Environment

Exemplary computer readable media include flash memory drives, digital versatile discs (DVDs), compact discs (CDs), floppy disks, and tape cassettes. By way of example and not limitation, computer readable media comprise computer storage media and communication media. Computer storage media include volatile and nonvolatile, removable and non-removable media implemented in any method or technology for storage of information such as computer readable instructions, data structures, program modules or other data. Computer storage media are implemented in hardware and exclude carrier waves and propagated signals. Computer storage media for purposes of this disclosure are not signals per se. Exemplary computer storage media include hard disks, flash drives, and other solid-state memory. In contrast, communication media typically embody computer readable instructions, data structures, program modules, or other data in a modulated data signal such as a carrier wave or other transport mechanism and include any information delivery media.

Although described in connection with an exemplary computing system environment, examples of the disclosure are capable of implementation with numerous other general purpose or special purpose computing system environments, configurations, or devices.

Examples of well-known computing systems, environments, and/or configurations that may be suitable for use with aspects of the invention include, but are not limited to, mobile computing devices, personal computers, server computers, hand-held or laptop devices, multiprocessor systems, gaming consoles, microprocessor-based systems, set top boxes, programmable consumer electronics, mobile telephones, network PCs, minicomputers, mainframe computers, distributed computing environments that include any of the above systems or devices, and the like. Such systems or devices may accept input from the user in any way, including from input devices such as a keyboard or pointing device, via gesture input, and/or via voice input.

Examples of the invention may be described in the general context of computer-executable instructions, such as program modules, executed by one or more computers or other devices. The computer-executable instructions may be organized into one or more computer-executable components or modules. Generally, program modules include, but are not limited to, routines, programs, objects, components, and data structures that perform particular tasks or implement particular abstract data types. Aspects of the invention may be implemented with any number and organization of such components or modules. For example, aspects of the invention are not limited to the specific computer-executable instructions or the specific components or modules illustrated in the figures and described herein. Other examples of the invention may include different computer-executable instructions or components having more or less functionality than illustrated and described herein.

Aspects of the invention transform a general-purpose computer into a special-purpose computing device, such as the computing device 302 when configured to execute the instructions described herein.

The examples illustrated and described herein as well as examples not specifically described herein but within the scope of aspects of the invention constitute exemplary means for single channel acoustic noise reduction. For example, the elements illustrated in FIG. 2 and/or FIG. 3, such as when encoded to perform the operations illustrated in FIG. 4A, 4B, and/or FIG. 5, constitute exemplary means for transforming a noisy signal received by a computing device, exemplary means for determining feature vectors of the received noisy signal, exemplary means for accessing classification data corresponding to a plurality of user environments, exemplary means for comparing the determined feature vectors with the accessed classification data to identify a current user environment, exemplary means for estimating, based on the noise model and the SPP associated with the identified current user environment, a noise level from the transformed noisy signal, and exemplary means for reducing, based on the estimated noise level and the noise model and the SPP associated with the identified current user environment, the noise level from the transformed noisy signal to output an enhanced signal.

The order of execution or performance of the operations in examples of the invention illustrated and described herein is not essential, unless otherwise specified. That is, the operations may be performed in any order, unless otherwise specified, and examples of the invention may include additional or fewer operations than those disclosed herein. For example, it is contemplated that executing or performing a particular operation before, contemporaneously with, or after another operation is within the scope of aspects of the invention.

When introducing elements of aspects of the invention or the examples thereof, the articles "a," "an," "the," and "said" are intended to mean that there are one or more of the elements. The terms "comprising," "including," and "having" are intended to be inclusive and mean that there may be additional elements other than the listed elements. The term "exemplary" is intended to mean "an example of." The phrase "one or more of the following: A, B, and C" means "at least one of A and/or at least one of B and/or at least one of C."

Having described aspects of the invention in detail, it will be apparent that modifications and variations are possible without departing from the scope of aspects of the invention as defined in the appended claims. As various changes could be made in the above constructions, products, and methods without departing from the scope of aspects of the invention, it is intended that all matter contained in the above description and shown in the accompanying drawings shall be interpreted as illustrative and not in a limiting sense.

APPENDIX A

An exemplary MFCC noise model based on a second order Gaussian Mixture Model (GMM) is described below. Aspects of the disclosure are operable with other noise models, such as those based on DCT or gamma tone.

The particular noise model next described is for pub noise, and includes two components. In this example, MFCC may be used directly, or bark spectral energy may also be used as there is a one to one mapping between MFCC and bark spectral energy. Bark spectral energy results from spectral modeling of bark-bands energy. The values shown below in this example are from Barks Spectral Energy with a vector of size 20. The first derivative is also included, so there are 40 in a row.

The maximum quantity of components for the mixture is set to two in this example, although other quantities of components are contemplated. Given exemplary training data, the weight for each GMM has a mean of 0.3931 for the first component of the GMM and 0.6069 for the second component of the GMM. Exemplary values forming these means are listed below in Table A1.

TABLE A1

Exemplary Values for Calculating the Means of the GMM.

| | |
|---|---|
| 6.163859558059722 | 6.074984264209813 |
| 6.714453799272413 | 7.427130136509560 |
| 7.679828808253380 | 8.795728585032478 |
| 7.540027686802967 | 8.642413991021519 |
| 6.525080239801792 | 7.013557221735739 |
| 5.218298823815717 | 4.975173200422578 |
| 4.272919137093541 | 3.946924189191535 |
| 4.120518210579090 | 3.687582611836507 |
| 4.205052893012676 | 3.640406120885325 |
| 4.215340547803321 | 3.371234231236853 |
| 4.198811427695196 | 3.003120992521196 |
| 4.432206431059477 | 2.938229303896607 |
| 4.095361391934729 | 2.455978321416147 |
| 3.647334373353579 | 2.167911560024214 |
| 3.560526996917714 | 2.155170192928173 |
| 3.599677966754273 | 2.316667866309351 |
| 3.596852218856790 | 2.274933193390225 |
| 3.796400934636036 | 2.067495022020957 |
| 3.821009080004479 | 2.029848284668926 |
| 3.266748877183468 | 1.974419781398261 |

TABLE A1-continued

Exemplary Values for Calculating the Means of the GMM.

| | |
|---|---|
| −0.094282540436480 | 0.062147869234884 |
| −0.253252692724171 | 0.162715108100230 |
| −0.347608178516893 | 0.222905315819037 |
| −0.348055285863611 | 0.225396256953487 |
| 0.122013129838475 | −0.079018030549360 |
| 0.229475901361074 | −0.150343068207833 |
| 0.251872721158407 | −0.163539551672605 |
| 0.240761098399997 | −0.155717316784188 |
| 0.293617575165270 | −0.189852907655046 |
| 0.319652691062778 | −0.207765474497696 |
| 0.399894151471841 | −0.259286978965697 |
| 0.402684056217808 | −0.261585032166253 |
| 0.384747973786382 | −0.249598515458937 |
| 0.351040602938050 | −0.227695354859615 |
| 0.339677975430498 | −0.219988327197916 |
| 0.341318656787847 | −0.221054867147019 |
| 0.340405380654664 | −0.220888126742948 |
| 0.295434838011544 | −0.191508720892027 |
| 0.287555587576783 | −0.185875595501006 |
| 0.272871699830388 | −0.176419983691555 |

Exemplary values forming variances are listed below in Table A2. The first column shows the first component of the mixture and the second column shows the second component of the mixture.

TABLE A2

Exemplary Values for Calculating the Variances of the GMM.

| | |
|---|---|
| 7.607949871253470 | 9.539932918270143 |
| 7.283978976962029 | 9.915855887206893 |
| 9.797680650902915 | 13.347539103376411 |
| 9.485044768228997 | 15.580683311663650 |
| 8.906594633415663 | 15.645588146739042 |
| 7.267255966167208 | 8.177059064999284 |
| 4.715080657112520 | 4.882342424217333 |
| 4.510860899593372 | 4.054772597125602 |
| 4.595016094576774 | 3.631724879436578 |
| 4.291216081217145 | 2.850712963532208 |
| 3.935840873292526 | 1.655979742409847 |
| 4.374147397302530 | 1.759867844750741 |
| 3.656424524827448 | 1.140185166219236 |
| 2.750269743612912 | 0.832376172314925 |
| 2.297459017010559 | 0.770650153345351 |
| 2.138875158203981 | 0.724183461802183 |
| 1.950399785897513 | 0.679367432941881 |
| 3.805883017541408 | 0.652045360182579 |
| 5.254175811508886 | 0.624674604254023 |
| 3.379831789761659 | 0.513665157501775 |
| 9.219776503875020 | 8.802894759469542 |
| 10.884257945404778 | 10.308432156778915 |
| 12.955156618603693 | 12.175579235328904 |
| 12.188155259956984 | 11.143442595618980 |
| 8.514498518236165 | 9.485255240435400 |
| 6.355158372412883 | 6.320668242637635 |
| 4.421831736188832 | 4.218667399757280 |
| 4.121248195043635 | 3.370294917093570 |
| 3.871261266221065 | 3.430896664185065 |
| 3.883121753669251 | 2.848959469715307 |
| 3.842093000393839 | 2.096495877183404 |
| 3.549552718653349 | 2.020814634607120 |
| 3.590029623641171 | 1.365405911541951 |
| 2.685811328161725 | 1.095509414212162 |
| 2.365990871564562 | 0.981749449061960 |
| 2.286937794274912 | 1.003188483487362 |
| 2.096949805310303 | 0.954512744268344 |
| 2.734435423765378 | 0.737326066895469 |
| 2.882120011712366 | 0.658772658549217 |
| 2.160640646378196 | 0.601704608709013 |

The values shown in Tables A1 and A2 above provide values for the pub noise environment when using bark spectral energy. The GMM may include additional derivatives, in other examples. For example, if the second derivative had been considered, all vectors will have 60 elements.

What is claimed is:

1. A system for providing user environment aware acoustic noise reduction, said system comprising:
   a memory area for storing classification data corresponding to a plurality of locations, the classification data for each location including a noise model associated therewith; and
   a processor programmed to:
   receive a noisy signal and create a transform of the received noisy signal, the noisy signal including a speech signal and a noise signal;
   determine feature vectors of the received noisy signal;
   compare the determined feature vectors with the classification data stored in the memory area to identify a current user location;
   based on the noise model associated with the identified current user location, estimate a noise level and a speech level for the transformed noisy signal;
   estimate a speech presence probability based on the noise model, the estimated noise level, and the estimated speech level for the transformed noisy signal;
   based on the estimated noise level, the estimated speech level, the estimated speech presence probability, and the noise model associated with the identified current user location, reduce the noise signal from the transformed noisy signal; and
   upon reducing the noise signal, output an enhanced version of the speech signal from the noisy signal.

2. The system of claim 1, wherein the processor is further programmed to confirm the identified current user location upon determining that the identified current user location is the same for at least a predefined number of frames of the noisy signal.

3. The system of claim 1, wherein the noisy signal includes only the noise signal for at least a predefined time period upon beginning the identification of the current user location.

4. The system of claim 1, wherein the memory area further stores a running signal-to-noise ratio (SNR) histogram for each of the plurality of locations and the processor is programmed to identify the current user location by:
   calculating a SNR histogram for the received noisy signal;
   comparing the calculated SNR histogram with the SNR histograms for the plurality of locations; and
   identifying the current user location based on the comparison.

5. The system of claim 1, wherein the processor is further programmed to repeat, after a predefined time period, identification of the current user location based on an updated noisy signal.

6. The system of claim 1, wherein the noise model associated with the identified current user location describes noise from a car, a pub, a café, pink noise, or clean speech.

7. The system of claim 1, wherein the processor is further programmed to:
   calculate a mean and a variance of the determined feature vectors; and
   compare the calculated mean and the variance with the classification data to identify the noise model for the current user location.

8. The system of claim 1, wherein the processor is further programmed to:
   inversely transform the outputted enhanced speech signal; and
   revise the classification data for the identified current user location based on the inversely transformed enhanced speech signal.

9. The system of claim 1, wherein the processor is further programmed to identify the current user location by considering data selected from a group consisting of data from a gyroscope, data from back end speech recognition, or speaker-speech characteristics.

10. The system of claim 1, wherein the processor is programmed to create the transform of the received noisy signal in a frequency domain, and wherein the processor is programmed to determine the feature vectors of the received noisy signal by computing Mel-Scale frequency cepstral coefficients (MFCC).

11. A method comprising:
    transforming a noisy signal received by a computing device;
    determining feature vectors of the received noisy signal;
    accessing classification data corresponding to a plurality of locations, the classification data for each of the locations including a noise model associated therewith;
    comparing the determined feature vectors with the accessed classification data to identify a current user location;
    based on the noise model associated with the identified current user location, estimating a noise level and a speech level for the transformed noisy signal;
    estimating a speech presence probability based on the noise model, the estimated noise level, and the estimated speech level for the transformed noisy signal; and
    based on the estimated noise level, the speech level, and the speech presence probability and the noise model associated with the identified current user location, reducing a noise signal from the transformed noisy signal to output an enhanced signal.

12. The method of claim 11, further comprising confirming the identified current user location by identifying a most frequently identified current user location over a predefined time period.

13. The method of claim 11, wherein a memory area associated with the computing device stores a signal-to-noise ratio (SNR) histogram for each of the locations and the identification of the current user location is performed by:
    calculating a SNR histogram for the received noisy signal;
    comparing the calculated SNR histogram with the SNR histograms for the plurality of locations; and
    identifying the current user location based on the comparison of the calculated SNR histogram with the SNR histograms for the plurality of locations.

14. The method of claim 11, further comprising:
    applying a known speech signal to the plurality of locations; and
    upon applying the known speech signal, characterizing each of the plurality of locations using machine learning to define at least a portion of the classification data.

15. The method of claim 11, wherein the noise model enables estimation of the noise level, the speech level, and the speech presence probability based on thresholds.

16. The method of claim 11, wherein transforming the noisy signal comprises transforming the noisy signal in a frequency domain, and wherein determining the feature vectors of the received noisy signal comprises computing Mel-Scale frequency cepstral coefficients (MFCC).

17. A computer storage media storing computer executable components executable by a processor associated with a computing device, said components comprising:

a transformation component that when executed by at least one processor causes the at least one processor to transform a noisy signal received by a computing device;

a determination component that when executed by at least one processor causes the at least one processor to determine feature vectors of the received noisy signal;

a classification component that when executed by at least one processor causes the at least one processor to access classification data corresponding to a plurality locations, the classification data for each location including a noise model associated therewith;

an identification component that when executed by at least one processor causes the at least one processor to identify a current user location of the computing device based on a comparison of the feature vectors determined by the determination component with the classification data accessed by the classification component;

an estimation component that when executed by at least one processor causes the at least one processor to:
based on the noise model associated with the current user location identified by the identification component, estimate a noise level and a speech level for the transformed noisy signal;
estimate a speech presence probability based on the noise model, the estimated noise level, and the estimated speech level for the transformed noisy signal; and a noise reduction component that when executed by at least one processor causes the at least one processor to, based on the noise level, the speech level, and the speech presence probability estimated by the estimation component and the noise model associated with the current user location, reduce a noise signal from the transformed noisy signal to output an enhanced signal.

18. The computer storage media of claim 17, further comprising:
an inverse transformation component that when executed by at least one processor causes the at least one processor to inversely transform the enhanced signal outputted by the noise reduction component; and
a feedback component that when executed by at least one processor causes the at least one processor to adjust the classification data for the identified current user location based on the inversely transformed, enhanced signal.

19. The computer storage media of claim 17, wherein said identification of the current user location by the identification component further comprises incorporating data from a group consisting of data from a gyroscope, data from back-end speech recognition, or data describing speaker-speech characteristics.

20. The computer storage media of claim 17, wherein the determination component determines the feature vectors of the received noisy signal by computing Mel-Scale frequency cepstral coefficients (MFCC) and the received noisy signal is transformed in a frequency domain.

* * * * *